United States Patent [19]
Coutellier et al.

[11] Patent Number: 5,282,104
[45] Date of Patent: Jan. 25, 1994

[54] MAGNETIC READING DEVICE WITH READ HEAD MATRIX NETWORK

[75] Inventors: Jean-Marc Coutellier, Maurepas; Thierry Valet, Viroflay; Francois X. Pirot, Les Ulis; Joseph Colineau, Bures S/Yvette, all of France

[73] Assignee: Thomson-CSF, Puteaux, France

[21] Appl. No.: 46,915

[22] Filed: Apr. 14, 1993

Related U.S. Application Data

[63] Continuation of Ser. No. 732,796, Jul. 19, 1991, abandoned.

[30] Foreign Application Priority Data

Jul. 20, 1990 [FR] France .................... 90 09302

[51] Int. Cl.$^5$ .................... G11B 5/39; G11B 5/48; G11B 5/027
[52] U.S. Cl. .................... 360/115; 360/63; 360/113
[58] Field of Search ............ 360/115, 113, 63, 123, 360/126

[56] References Cited

U.S. PATENT DOCUMENTS

| | | | |
|---|---|---|---|
| 3,456,250 | 7/1969 | Barcard et al. | 360/115 |
| 4,275,428 | 6/1981 | Lehureau | 360/113 |
| 4,616,272 | 10/1986 | Moriyama | 360/47 |
| 5,089,923 | 2/1992 | Lehureau | 360/115 |

FOREIGN PATENT DOCUMENTS

| | | |
|---|---|---|
| 0009531 | 4/1980 | European Pat. Off. . |
| 1193549 | 5/1965 | Fed. Rep. of Germany . |
| 58-150124 | 9/1983 | Japan . |
| 61-153897 | 7/1986 | Japan . |
| 7510306 | 11/1975 | Netherlands . |

OTHER PUBLICATIONS

T. A. Schwarz, IBM Tech. Disclosure Bulletin, "Magnetoresistive Head Drive Circuit", vol. 18, No. 11, Apr. 1976.

E. G. Lean et al, IBM Tech. Disclosure Bulletin, "Scanning Tapped Magnetoresistive Sensor", vol. 17, No. 12, May 1975.

*Primary Examiner*—Robert S. Tupper
*Attorney, Agent, or Firm*—Oblon, Spivak, McClelland, Maier & Neustadt

[57] ABSTRACT

A magnetic reading device, of the type comprising multiple magnetic read heads, incorporates read heads each formed by a magneto-resistance element having a resistance which varies as a function of an outside magnetic field. The magnetic reading device comprises a network of line conductors intersected with a network of column conductors to form intersections at which a read head is provided. The first and second ends of each magneto-resistance element forming the read heads are respectively connected to a line conductor and to a column conductor of the corresponding intersection, and a control voltage is applied to the line and column conductors by a switching element for each line conductor, column conductors being connected to a current sensor. A simplification of the control of read heads results from this arrangement, while avoiding the effect of the heads not selected on the variations of current coming from the selected heads.

15 Claims, 2 Drawing Sheets

MAGNETIC READING DEVICE WITH READ HEAD MATRIX NETWORK

This application is a continuation of application Ser. No. 07/732,796, filed on July 19, 1991, now abandoned.

BACKGROUND OF THE INVENTION

1. Field of the Invention

The present invention relates to magnetic reading devices for reading a large number of magnetic tracks simultaneously, and more particularly to such magnetic reading devices having read heads in a stationary position relative to the magnetic tracks.

2. Background Discussion

Read heads frequently used for reading high density magnetic storage media are mounted on rotating heads, in particular when used in video recorders. The speed of rotation of the magnetic heads is high and it is combined with the movement of the magnetic tape. In this configuration, it is possible to extract a sufficient signal with a purely inductive read head, which is not the case when such a read head is stationary relative to the magnetic tape.

However, the solutions based on rotating magnetic heads present drawbacks, in particular in regard to weight and bulkiness, and also relative to reliability, particularly because of the relatively high speeds of rotation.

SUMMARY OF THE INVENTION

This invention has as an object a multi-track magnetic reading device, which is simple to produce and is able to integrate, in a small space, a large number of read heads capable of operating in a stationary position relative to a magnetic tape.

According to preferred embodiments of the present invention, these and other objects, advantages and features are achieved by a magnetic reading device comprising a plurality of multiple magnetic read heads, and a voltage generator delivering a control voltage. Each read head incorporates a magneto-resistance element having a variable electric resistor as a function of an outside magnetic field. The reading device is characterized as comprises a network of line conductors intersected with a network of column conductors, the read heads each being located approximately at an intersection of a line conductor with a column conductor. Each magneto-resistance element is connected by a first end to the line conductor of the corresponding intersection and by a second end to the column conductor of the same intersection, wherein each line conductor receives a first polarity of the control voltage by a switching element, and wherein each column conductor is connected to the second polarity of the control voltage, and to a current sensor.

BRIEF DESCRIPTION OF THE DRAWINGS

The invention will be understood better from reading the following description, given by way of nonlimiting example with reference to the accompanying figures of which.

DETAILED DESCRIPTION OF THE PREFERRED EMBODIMENTS

Figure 1:
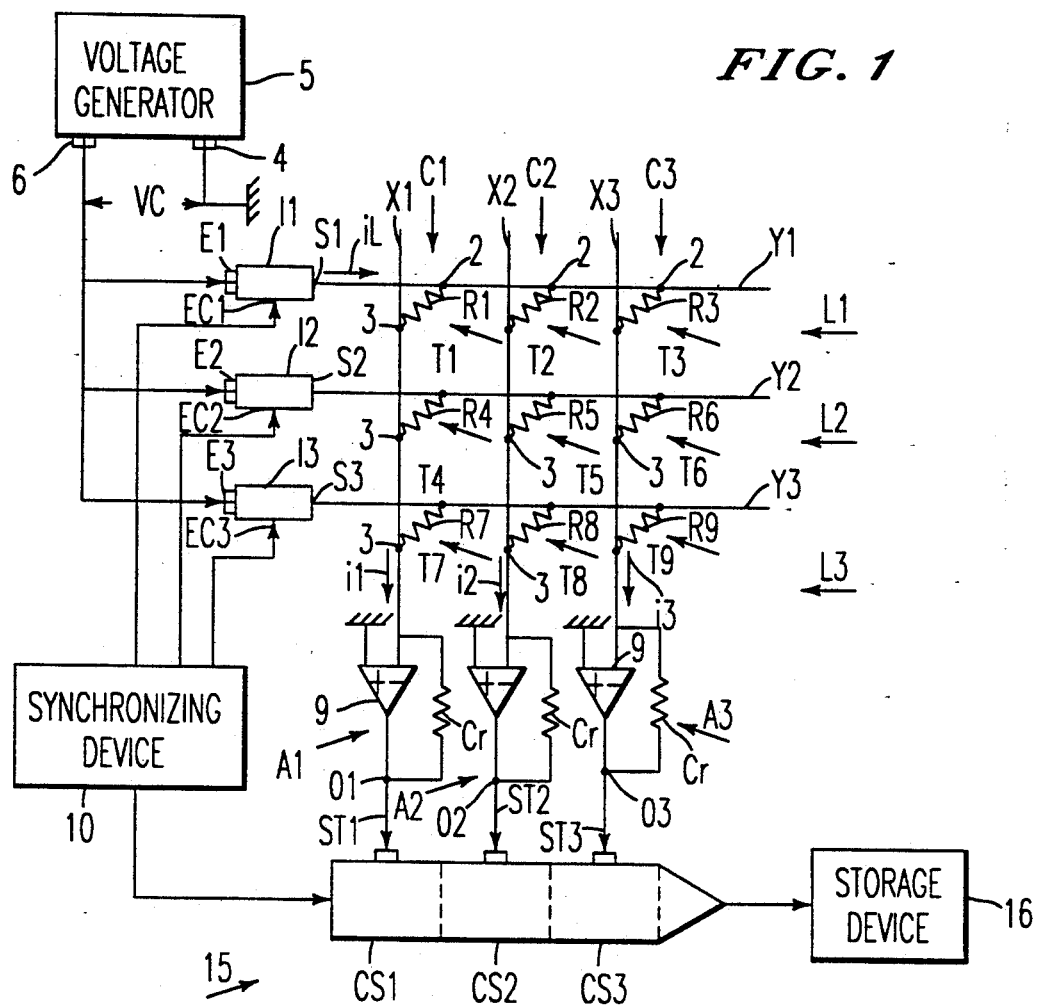
FIG. 1 is an electrical diagram of a magnetic reading device according to one embodiment of the present invention.

FIG. 1 shows a magnetic reading device according to the present invention, comprising multiple magnetic read heads forming a matrix network. To simplify FIG. 1, only nine read heads T1 to T9 are represented which form three read head lines L1, L2, L3 and three read columns C1, C2, C3. But, of course, in the spirit of the invention, the number of read heads can be different and in particular much larger.

Magnetic device 1 comprises a network of line conductors Y1 to Y3 and a network of column conductors X1 to X3. Each line conductor Y1 to Y3 and each column conductor X1 to X3 correspond respectively to a line L1 to L3 and to a column C1 to C3 of read heads T1 to T9. Line conductors Y1 to Y3 and column conductors X1 to X3 respectively intersect, and a read head T1 to T9 corresponds to each intersection of these conductors.

In the reading device of FIG. 1, the read heads T1 to T9 operate by using a magneto-resistance effect. Read heads T1 to T9 each comprise a material whose resistivity varies as a function of the magnetic field to which this material is subjected. A control voltage is applied to the terminals of the magneto-resistance element, i.e., between opposite faces or ends of this material. The current which is then produced in this material varies with the resistivity of the latter, and the current variations reflect the variations of the magnetic field to be read to which the magneto-resistance element is subjected.

The magneto-resistance effect sensors are well known in the art. They are commonly produced in alloys such as, for example, permalloy ($Fe_{80}Ni_{20}$).

It is possible to find detailed explanations on the magneto-resistance effect and magneto-resistance sensor production in the article of D. THOMPSON published in IEEE TRANSACTION ON MAGNETICS, Vol. II, No. 4, 1975, page 1039.

The variations of the magnetic field recorded on a magnetic track (not shown) being reflected by a variation of the electrical resistance of the magneto-resistance material, magnetic read heads T1 to T9 are represented in FIG. 1 in the form of resistors R1 to R9, respectively.

In practice, each read head T1 to T9 is produced close to an intersection of a line conductor Y1 to Y3 with a column conductor X1 to X3 at the same intersection. Thus, for example, for first line L1 of head T1 to T3, three resistors R1 to R3 have their first end 2 connected to first line conductor Y1 and their second end 3 connected respectively to first, second and third column conductor X1, X2 and X3.

Magnetic reading device 1 also includes a voltage generator 5, producing a dc control voltage VC, intended to be applied to the terminals of resistors R1 to R9.

According to one feature of the present invention, each line conductor Y1 to Y3 receives one of the polarities of control voltage VC by a switching element I1, I2, I3. Each switching element can be put either in the "blocked" state or in the "passing" state, i.e., in the "blocked state, switching elements I1 to I3 have a very high impedance, and in the "Passing" state, they have a very low impedance.

Voltage generator 5 delivers the two polarities of control voltage VC by two outputs 4, 6, the second output 4 being connected to a reference voltage such as the ground, for example, and a first output 6, delivering a first polarity, being connected to an input E1 to E3 of all switching elements I1 to I3.

Outputs S1, S2, S3 of switching elements I1, I2, I3 are each respectively connected to a line conductor Y1, Y2, Y3.

Switching elements I1 to I3 perform a switch function, i.e., they open or close the circuit between the first polarity of control voltage VC and each of line conductors Y1 to Y3. These switching elements can consist of various components which are standard in the art, for example, the contacts of an electro-mechanical relay; but for the sake of switching speed, it is preferred to use electronic gates, for example, of the analog type, which can have "passing" or "blocked" states compatible with those which are necessary in this application, with quick transitions.

Actually, each resistor R1 to R9 of the magneto-resistance elements is commonly on the order of 10 ohms. Under a control voltage VC on the order of 1 volt, for example, the nominal current in each resistor R1 to R9 is on the order of 0.1 ampere, and the variations of the current due to the magnetic field to be read can reach several % of the nominal current according to the type of magneto-resistance element. It is, therefore, preferred for a good measuring precision, that voltage generator 5 comprise an internal low resistance and that all the elements placed in series with resistors R1 to R9 of the magneto-resistance elements have a low resistance.

With such an arrangement, selected read heads T1 to T9 are activated line by line L1, L2, L3 by applying control voltage VC only to resistors corresponding to a single line, by controlling the "passing" state of corresponding switching element I1 to I3. For this purpose, a control input Ec1 to Ec3, of each of the switching elements, is connected to a device for control and synchronization 10 which is standard in the art; the latter delivers, for example, a control signal to the selected switching element to be made "passing," and in the absence of such a signal, each switching element preferably maintains the "blocked" state.

According to another feature of the present invention, all column conductors X1, X2, X3 are brought continuously to the potential of the reference voltage, i.e., to the ground in this example, this potential corresponding to the second polarity of control voltage VC; and, all the column conductors are each connected continuously to a current sensor A1, A2, A3.

In the nonlimiting example described, the current sensors are mounted in series between each column conductor X1 to X3 and the second polarity of the control voltage VC. Consequently, these current sensors A1 to A3 each include an amplifier 9 of the operational amplifier type, for example, according to a standard assembly which makes it possible, with an amplifier having a sufficient gain, to obtain an almost zero input impedance. In the nonlimiting example described, each amplifier 9 includes a positive input (+), and a negative input (−). Further the amplifiers 9, illustrated in FIG. 1, respectively have outputs 01, 02, 03, each amplifier 9 having a negative feedback resistor Cr connected between negative input (−) and its respective output 01 to 03. Each column conductor X1 to X3 is connected to a negative input (−) of an amplifier 9. Each positive amplifier input (+) is connected to the potential of the ground so that this potential is transferred to each column conductor X1 to X3 through a very low impedance. Respective outputs 01 to 03 amplifiers 9 deliver a voltage signal whose amplitude is a function of the current which flows in a respective one of column conductors X1 to X3 to which the amplifier 9 is connected.

In the described configuration, the addressing of a selected one of the lines L1 to L3 of selected read heads is performed by controlling the "passing" state of a corresponding switching element I1 to I3 of the selected line. The control voltage is then applied to the resistors of this selected line, from which results in corresponding line conductor Y1 to Y3, a line current I1 which is the sum of the currents in all the resistors of this line. Further, in each column conductor X1 to X3 a current i1 to i3 flows which is characteristic of the resistance of each resistor of the selected line, i.e., of each one of read heads which form the selected one of the addressed lines L1 to L3.

Thus, for example, if the addressed line is first line L1: current i1 which flows in the first column conductor X1 corresponds to the current of first read head T1; currents i2 and i3 which flow respectively in second and third column conductor X2 and X3 correspond respectively to second and third head T2 and T3. When second switching element I2 is "passing," other elements I1, I3 are "blocked," and currents i1, i2 and i3 correspond respectively to fourth, fifth and sixth read head T4, T5, T6; and these currents are those which come from seventh, eighth and ninth read heads T7, T8, T9 when third switching element I3 is made "passing."

Control voltage VC being applied through a low impedance to line conductor Y1 to Y3 of a selected line L1 to L3, while the other line conductors of the lines not selected are in series with a very high impedance, resistors of the read heads not selected have no influence, in practice, on current i1 to i3 which flows in column conductors X1 to X3 and which is injected in amplifiers 9.

Currents i1 to i3 are, respectively, converted to voltage signals ST1 to ST3 by amplifiers 9, and these voltage signals are charged in a way standard in the art, in an acquisition register 15. Acquisition register 15 is a shift register, for example, comprising storage cases CS1 to CS3 each capable of storing an analog value. Acquisition register 15 comprises as many storage cases CS1 to CS3 as there are column conductors X1 to X3, and each amplifier output is respectively connected to one such storage case.

The chargings of voltage signals ST1 to ST3 are performed simultaneously for an entire selected line, and between each charging of acquisition register 15, the data contained in this register is transferred to a storage device 16, under the control of device for control and synchronization 10. Thus, it is possible to address all the read heads T1 to T9 line by line, and in particular, in a cyclic way, at a speed which is linked to the dimension of the data recorded on a magnetic tape to be read and in accordance with the advancing speed of this tape.

It is, of course, possible to use many other methods, all known to the expert, to achieve the acquisition of voltage signals ST1 to ST3 delivered by amplifiers A1 to A3. For example, the outputs of amplifiers can be connected to acquisition devices (not shown) independent of one another.

In the foregoing description, the name "line" or "column," given to the conductors, is arbitrary and does not necessarily define their orientation. It should further be noted that the line conductors are not necessarily perpendicular to the column conductors, and that the distribution of the functions attributed to the line and column conductors can be reversed between the latter.

FIGS. 2a to 2e represent steps of a process of manufacturing the magneto-resistance read heads of the present invention, for example, by a standard thin layer film technology. This process is indicated only by way of nonlimiting example to show that it is possible to manufacture each read head between a line conductor and a column conductor as shown in FIG. 1.

Figure 2A:
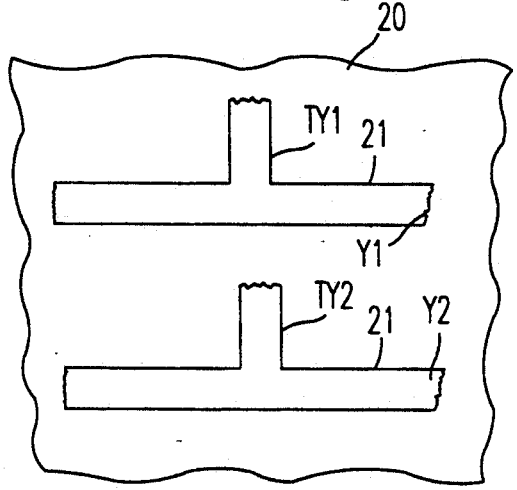
FIGS. 2a to 2e illustrate stages of one embodiment of a process for manufacturing the magneto-resistant read heads of the present invention.

FIG. 2a is a top view which illustrates the formation, on a substrate 20, of glass or insulating silicon, for example, of two parallel conductors 21, constituting two line conductors Y1, Y2. These two line conductors are produced, for example, by engraving an electrically conductive layer, deposited on substrate 20. Each line conductor Y1, Y2 comprises a section TY1, TY2 approximately perpendicular to the general direction of the associated line conductors.

Figure 2B:
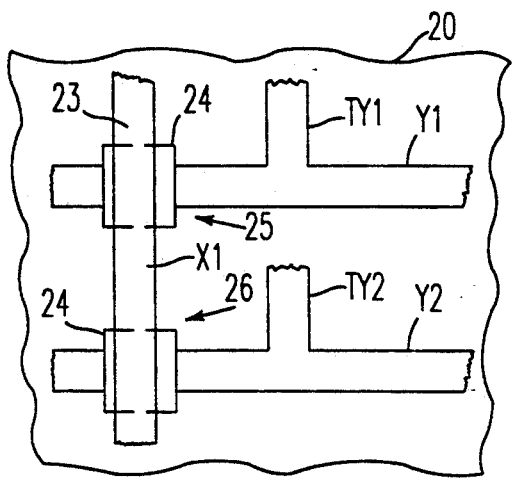

FIG. 2b shows that a third conductor 23 perpendicular to two line conductors Y1, Y2, is formed, for example, above the latter. This third column 23 constitutes a column conductor, first column conductor X1, for example. First column conductor X1 intersects and covers line conductors Y1, Y2, from which it is electrically insulated by an insulating layer 24, which, after engraving, exists only at intersections 25, 26.

Figure 2C:
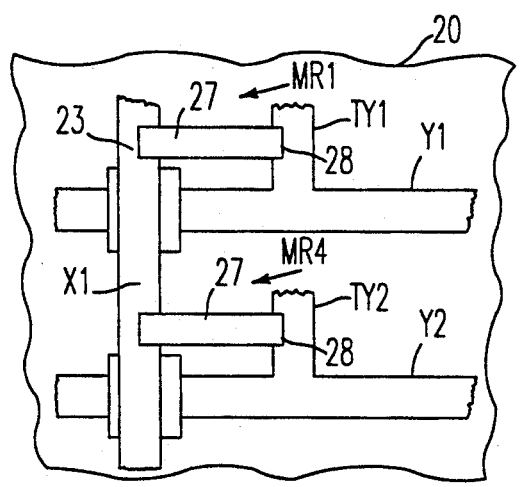

FIG. 2c illustrates the formation of magneto-resistance elements MR1, MR4 of read heads Ti, T4 shown in FIG. 1. These magneto-resistance elements MR1, MR4 are of the type comprising a magneto-resistance layer, for example, of permalloy ($Fe_{80}Ni_{20}$) and a ferromagnetic layer (for the polarization of the magneto-resistance layer), for example of $Fe_xMn_y$. These two layers are produced successively to be superimposed (perpendicular to the plane of the figure) and to be extended from each section TY1, TY2 to column conductor X1. A first end 27 of these superimposed layers is in electrical contact with first column conductor Xi that it partially covers; and a second end 28 of these superimposed layers is in contact with a respective one of the line sections TY1, TY2 that it partially covers. The distance between first column conductor Xi and sections TY1, TY2 represent the active length of magneto-resistance elements MR1, MR4, i.e., length L of resistors R1, R4.

Figure 2D:
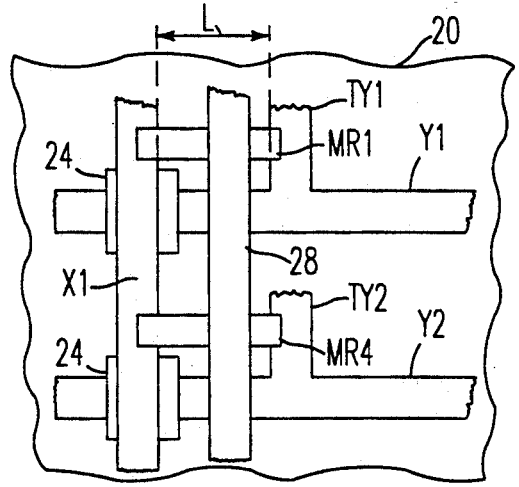

FIG. 2d represents a subsequent step of the manufacturing process in which a spacer 28 is formed above a central part of each magneto-resistance element MR1, MR4. Actually, spacer 28 is common to two read heads T1, T4. The spacer 28 comprises a strip or tape parallel to first column conductor X1 and which is positioned between the latter and sections TY1, TY2. Spacer 28 is made of a nonmagnetic and electrically insulating material, of alumina $Al_2O_3$, for example, or $SiO_2$.

Figure 2E:
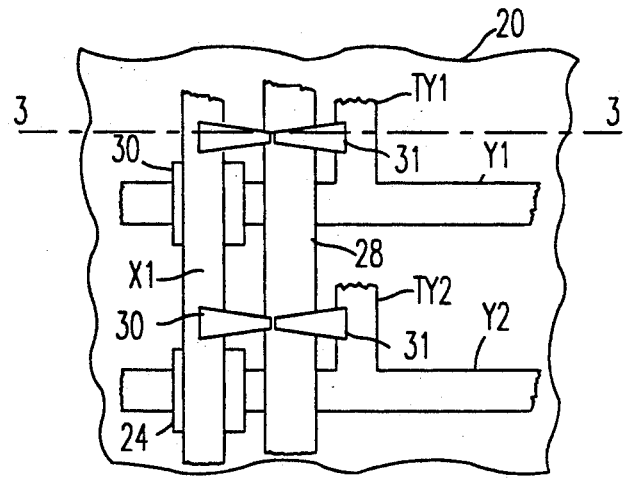

FIG. 2e illustrates a final step in which two magnetic poles 30, 31, separated by an air gap 32, have been formed above spacer 28 and the magneto-resistance elements for each read head T1, T4. These magnetic poles 30, 31 constitute a magnetic circuit forming a ring incorporating magneto-resistance element MR1, MR4 and which makes it possible to guide the magnetic flow to the latter.

Magnetic poles 30, 31 are of a magnetic material such as Sendust, for example, and they are produced in a way standard in the art by successive deposits and machinings of Sendust layers, as described, for example, in French patent application 86 14974 assigned to THOMSON-CSF.

Figure 3:
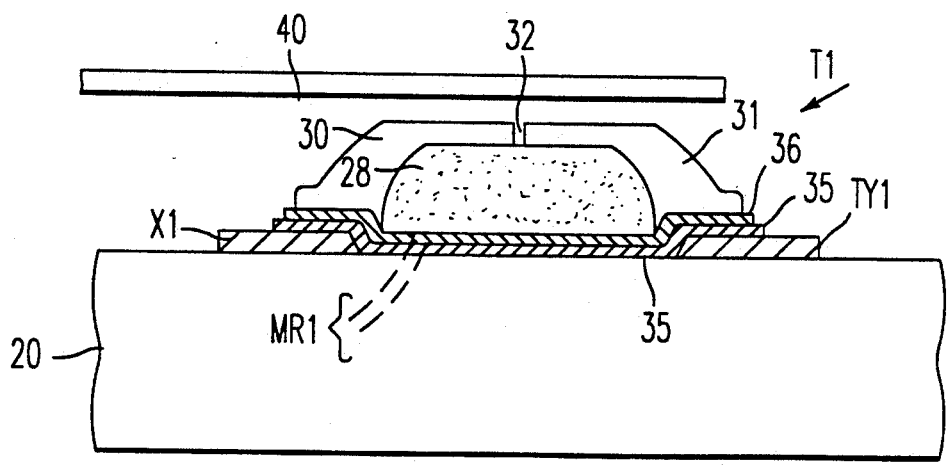
FIG. 3 is a view, in section, along section line 3—3 of FIG. 2e illustrating subsequent stages of the embodiment process.

FIG. 3 shows read head T1 by a view in section along an axis 3—3 of FIG. 2e. The elements already cited with reference to FIGS. 2a to 2e are found in FIG. 3 and designated by the same reference numerals.

Substrate 20 carries first column conductor X1 and first section TY1 between which first magneto-resistance element MR1 extends. Magneto-resistance element MR1 comprises a magneto-resistance layer 36 and a ferromagnetic layer 35 placed between substrate 20 and magneto-resistance layer 36. A central part of the magneto-resistance element carries spacer 28 around which magnetic poles 30, 31 are formed. Magnetic poles 30, 31 make it possible to guide the magnetic flow recorded on a magnetic tape 40 passing close to air gap 32 to magneto-resistance element MR1.

The read head structure and its embodiment shown in FIGS. 2a to 2e and in FIG. 3 are given by way of nonlimiting example. In particular, the addressing mode of read heads T1 to T9, describe with reference to FIG. 1, can be applied advantageously to all types of magneto-resistance elements, for example, the multilayer magneto-resistance structures with "giant" magneto-resistance effect, since the number of read heads is large enough that an effort is made to reduce the number of conductors of connections and an effort is made to cancel the effect of the read heads not selected on the current of the selected heads.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A magnetic reading device, comprising:
    a plurality of magnetic read heads, each read head comprising a magnetoresistance element having a resistance which varies as a function of a magnetic field generated by an external magnetic field;
    a plurality of line conductors intersecting with a plurality of column conductors with a respective read head being located approximately at the intersection of a respective pair of one of the line conductors and one of the column conductors, a magneto-resistance element of said respective read head having one end connected to the line conductor of said respective pair and another end connected to the column conductor of said respective pair, each column conductor of said plurality being furthermore, connected to a respective detector,
    means for maintaining all the column conductors substantially at a common first electrical potential,
    means for applying a second electrical potential on a selected line conductor of the plurality of line conductors while leaving all other line conductors substantially at said first potential.

2. A reading device according to claim 1 wherein said detector is a current sensor capable of providing an output signal which is a function of a current supplied by the column conductor to which it is connected.

3. A reading device according to claim 2, wherein:
said current sensor comprises a differential amplifier having a low input impedance and having a first input and a second input, and
wherein said means for maintaining all the column conductors substantially at a first electrical potential comprises a connection between a column conductor and the first input of the differential amplifier, and a connection between the second input of the differential amplifier and a voltage source at said first potential.

4. A reading device according to one of claims 1 to 3, wherein said means for applying a second electrical potential on a selected line comprises means for maintaining in a high impedance state, said all other line conductors.

5. A reading device according to one of claims 1 to 3, further comprising addressing means for addressing read heads selected line by line, in a cyclic manner.

6. A reading device according to claim 5, further comprising means for simultaneously storing signals delivered by each of read heads of a selected line.

7. A reading device according claim 1, wherein line and column conductors and read heads are produced on a same substrate and wherein each magneto-resistance element comprises a magneto-resistance layer of which a first end is connected to a column conductor and of which a selected end is connected to a line conductor.

8. A reading device according to claim 7, wherein a length of the magneto-resistance layer constitutes electric resistor.

9. A reading device according to claim 7, wherein magneto-resistance layer is approximately parallel to substrate.

10. A reading device according to claim 7, further comprising a ferromagnetic polarization layer placed between substrate and magneto-resistance layer.

11. A reading device according to claim 7, wherein each magneto-resistance layer is connected to a line conductor by a section placed parallel to column conductors.

12. A reading device according to claim 2 wherein said current sensor comprises differentia amplifiers having a low input impedance and each having a first input and a second input, and wherein said means for maintaining all column conductors substantially at a first electrical potential comprise a connection between each respective column conductor and the first input of a respective differential amplifier, and a connection between the second input of each differential amplifier and a voltage source at said first potential.

13. A magnetic reading device for reading a magnetic recording tape, comprising:
a plurality of magnetic read heads, each read head comprising a magnetoresistance element having a resistance which varies as a function of a magnetic field generated by information recorded on said magnetic tape,
a plurality of line conductors intersecting with a plurality of column conductors with a respective read head being located approximately at the intersection of a respective pair of a line conductor and a column conductor, a magnetoresistance element of said respective read head having one end connected to the line conductor of said respective pair and another end connected to the column conductor of said respective pair, each column conductor of said plurality of column conductors being furthermore connected to a respective detector,
means for maintaining all the column conductors substantially at a common first electrical potential,
means for applying a second electrical potential on a selected line conductor while leaving all the other line conductors substantially at said first potential.

14. A reading device according to claim 13 wherein said detector is a current sensor capable of providing an output signal which is a function of a current supplied by the column conductor to which it is connected.

15. A reading device according to one of claims 12 to 14, wherein said means for applying a second electrical potential on a selected line comprises means for maintaining in a high impedance state all said other line conductors.

* * * * *